(12) United States Patent
Zandian et al.

(10) Patent No.: US 9,520,336 B1
(45) Date of Patent: Dec. 13, 2016

(54) HYBRID ASSEMBLY WITH IMPROVED THERMAL PERFORMANCE

(71) Applicant: TELEDYNE SCIENTIFIC & IMAGING, LLC, Thousand Oaks, CA (US)

(72) Inventors: Majid Zandian, Calabasas, CA (US); Donald E. Cooper, Moorpark, CA (US); Lisa L. Fischer, Ventura, CA (US); Victor Gil, Woodland Hills, CA (US); Gerard Sullivan, Newbury Park, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 14/994,618

(22) Filed: Jan. 13, 2016

Related U.S. Application Data

(60) Provisional application No. 62/210,876, filed on Aug. 27, 2015.

(51) Int. Cl.
| | |
|---|---|
| H01L 23/373 | (2006.01) |
| H01L 23/367 | (2006.01) |
| H01L 25/00 | (2006.01) |
| H01L 25/16 | (2006.01) |
| H01L 21/48 | (2006.01) |
| H01L 25/065 | (2006.01) |

(52) U.S. Cl.
CPC ....... *H01L 23/3672* (2013.01); *H01L 21/4871* (2013.01); *H01L 23/3736* (2013.01); *H01L 25/0657* (2013.01); *H01L 25/167* (2013.01); *H01L 25/50* (2013.01)

(58) Field of Classification Search
CPC .................................................. H01L 21/4814
See application file for complete search history.

(56) References Cited

U.S. PATENT DOCUMENTS

| | | |
|---|---|---|
| 4,197,633 A | 4/1980 | Lorenze, Jr. et al. |
| 4,290,844 A | 9/1981 | Rotolante et al. |
| 4,352,715 A | 10/1982 | Carson et al. |
| 4,551,629 A | 11/1985 | Carson et al. |
| 4,672,737 A | 6/1987 | Carson et al. |
| 4,783,594 A | 11/1988 | Schulte et al. |
| 5,196,652 A | 3/1993 | Mikkelsen, Jr. et al. |
| 5,446,284 A | 8/1995 | Butler et al. |

(Continued)

*Primary Examiner* — Cheung Lee
(74) *Attorney, Agent, or Firm* — Koppel, Patrick, Heybl & Philpott

(57) ABSTRACT

A method of improving the thermal performance of a hybrid assembly which comprises a first die, a second die, and indium bonds which bond and electrically interconnect the first die to the second die. A heat sink plate on which the hybrid assembly is to be mounted is provided. A plurality of indium bumps are deposited on the plate where the assembly is to be mounted. The bottom side of the hybrid assembly is then pressed onto the indium bumps to affix the assembly to the plate. The heat sink plate constrains the lateral coefficient of thermal expansion (CTE) of the second die such that the CTEs of the first and second dies match more closely than they would if the hybrid assembly was not mounted directly to a heat sink plate using indium bumps. The heat sink plate preferably comprises copper tungsten (CuW) or a diamond-metal composite.

9 Claims, 1 Drawing Sheet

(56) References Cited

U.S. PATENT DOCUMENTS

| | | |
|---|---|---|
| 6,562,127 B1 | 5/2003 | Kud et al. |
| 6,675,600 B1 | 1/2004 | Robillard et al. |
| 7,230,227 B2 | 6/2007 | Wilcken et al. |
| 7,723,815 B1 | 5/2010 | Peterson et al. |
| 7,742,120 B2 | 6/2010 | Bayley et al. |
| 8,305,294 B2 | 11/2012 | Cok et al. |
| 2003/0234343 A1 | 12/2003 | Cok et al. |
| 2005/0256241 A1* | 11/2005 | Sachdev ................ C08K 3/08 524/439 |
| 2006/0108915 A1 | 5/2006 | Cok et al. |
| 2008/0217717 A1 | 9/2008 | Pfister et al. |
| 2011/0096507 A1* | 4/2011 | Deram ................ H01L 23/3733 361/718 |
| 2015/0083892 A1 | 3/2015 | Cooper et al. |
| 2015/0115433 A1* | 4/2015 | Lin .................... H01L 23/3675 257/712 |

\* cited by examiner

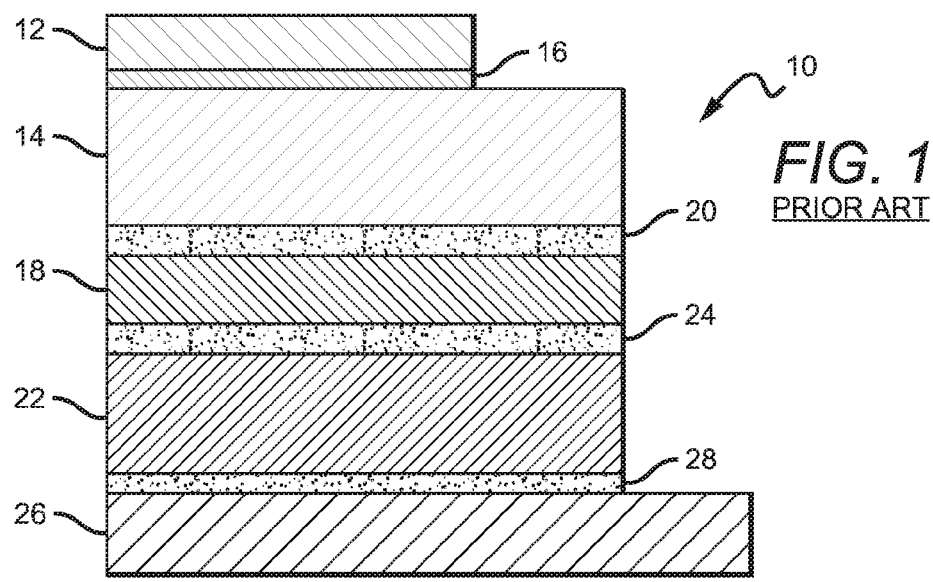
*FIG. 1*
PRIOR ART
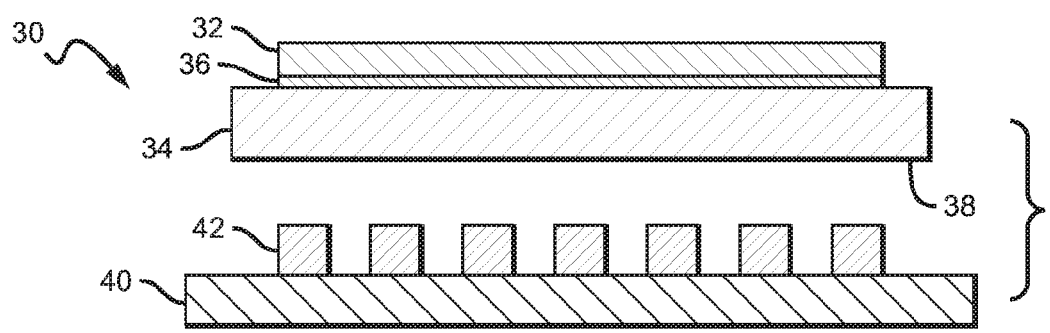
*FIG. 2*
*FIG. 3*
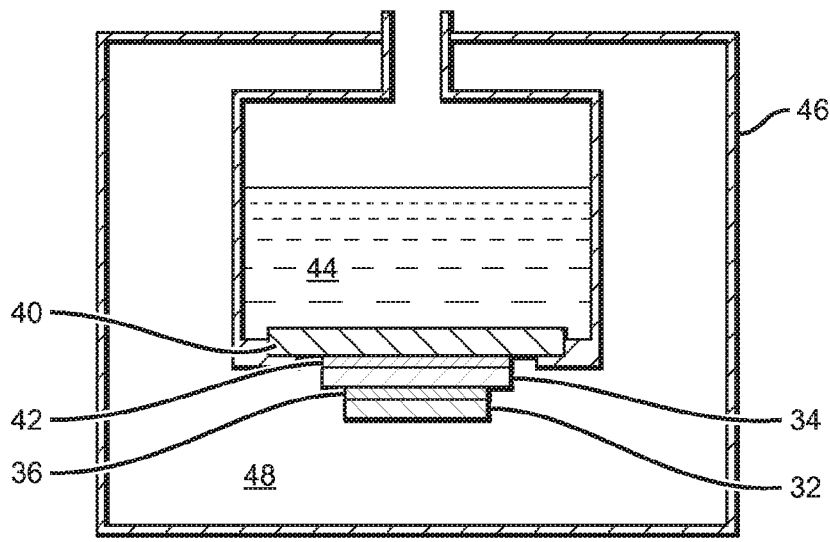

HYBRID ASSEMBLY WITH IMPROVED THERMAL PERFORMANCE

RELATED APPLICATIONS

This application claims the benefit of provisional patent application No. 62/210,876 to Majid Zandian et al., filed Aug. 27, 2015.

BACKGROUND OF THE INVENTION

Field of the Invention

This invention relates generally to hybrid assemblies, and more particularly to methods of mounting such hybrid assemblies such that they exhibit good thermal performance.

Description of the Related Art

A hybrid assembly comprises multiple interconnected integrated circuit (IC) dies. A number of methods are known for mounting a hybrid assembly to a baseplate. One possible method is shown in FIG. 1. Here the hybrid assembly 10 includes a first die 12, such as a mercury cadmium telluride (MCT) detector or a gallium antimonide (GaSb) superlattice LED (SLED) array IC, and a second die 14, such as a CMOS readout IC (ROIC) or a read-in IC (RIIC) on a silicon substrate (typically 250 µm thick); the first and second dies would typically be bonded together and electrically interconnected using a layer 16 of indium bumps and epoxy. To mitigate problems that might arise due to the first and second dies having different coefficients of thermal expansion (CTEs), a 'balanced composite substrate (BCS) stack structure is sometimes used. This requires mounting the second die 14 to a metal layer 18, typically 125 µm thick, using an epoxy adhesive layer 20, and mounting the metal layer 18 to a silicon layer 22, typically 250 µm thick, using an epoxy adhesive layer 24. This structure is then mounted to a baseplate 26, typically using an epoxy adhesive layer 28.

For proper operation, hybrid assemblies such as those described above are often actively cooled. The 250 µm thick silicon layers (14 and 22) are symmetrical about the middle of the stack so that, as the assembly is cooled, the structure does not bend due to different CTEs.

However, this mounting method results in three epoxy joints, each of which is typically about 37 µm thick. Standard epoxy has very poor thermal conductivity (TC) (~0.1 Watts/(meter*Kelvin)). As such, these epoxy joints dramatically restrict the vertical flow of heat from the CMOS or SLED at the top to the baseplate. Epoxies are available which are filled with high TC powders (silver or boron nitride or diamond) which can increase the TC, but the epoxy layers still disrupt the vertical heat flow. This poor vertical thermal conductivity can limit the performance of hybrid assemblies that inherently generate heat, such as SLEDs, or that operate best at low temperatures, such as IR detectors.

SUMMARY OF THE INVENTION

A method of improving the thermal performance of a hybrid assembly is presented.

The present method mounts a hybrid assembly on a heat sink plate. The hybrid assembly comprises a first die, a second die, and indium bonds which bond and electrically interconnect the first die to the second die. The side of the second die opposite the first die is referred to herein as the 'bottom side' of the hybrid assembly.

A heat sink plate on which the hybrid assembly is to be mounted is provided. A plurality of indium bumps are deposited on the heat sink plate where the hybrid assembly is to be mounted. Then, the bottom side of the hybrid assembly is pressed onto the indium bumps to affix the assembly to the plate.

When so arranged, the heat sink plate operates to constrain the lateral coefficient of thermal expansion (CTE) of the second die such that the CTEs of the first and second dies match more closely than they would if the bottom side of the hybrid assembly was not mounted directly to a heat sink plate using indium bumps. For example, if the first die comprises GaSb or MCT and the second die comprises silicon, the heat sink plate constrains the lateral CTE of the silicon such that the CTEs of the first and second dies match more closely than they would if the hybrid were mounted to a heat sink plate made of silicon. The heat sink plate preferably comprises copper tungsten (CuW) or a diamond-metal composite.

These and other features, aspects, and advantages of the present invention will become better understood with reference to the following drawings, description, and claims.

BRIEF DESCRIPTION OF THE DRAWINGS

FIG. 1 is a sectional view of a hybrid assembly which includes a 'balanced composite substrate' (BCS) stack structure.

FIG. 2 is a sectional view illustrating the present method of mounting a hybrid assembly on a heat sink plate.

FIG. 3 is a sectional view illustrating the present method of mounting a hybrid assembly on a heat sink plate, wherein the cryogenic coolant is in direct contact with the back of the heat sink plate.

DETAILED DESCRIPTION OF THE INVENTION

The present method is directed to improving the thermal performance of a packaged hybrid assembly; this is accomplished by mounting the hybrid assembly to a heat sink plate in the manner described herein.

The basic method is illustrated in FIG. 2. The hybrid assembly 30 typically includes a first die 32 and a second die 34 mounted on and electrically interconnected with the first die; the first die is commonly flip-chip mounted to the second die. The dies are bonded together and electrically interconnected using indium bumps; these are employed in layer 36 between the dies. The side 38 of the second die opposite the first die is referred to herein as the hybrid assembly's 'bottom side'.

A heat sink plate 40 is provided on which hybrid assembly 30 is to be mounted. A plurality of indium bumps 42 are deposited on heat sink plate 40 where the hybrid assembly is to be mounted. The bottom side of hybrid assembly 30 is then pressed onto the indium bumps such that is affixed to heat sink plate 40. The indium bumps are typically about 10 µm in diameter and about 10 µm in height. Millions of such bumps would typically be employed to affix a typical 3 cm×3 cm hybrid assembly to a heat sink plate. Heat sink plate 40 preferably comprises CuW or a diamond-metal composite. Following this, epoxy is preferably wicked into the gaps between the heat sink plate and hybrid assembly to further strengthen the bond between them.

When so arranged, heat sink plate 40 operates to constrain the lateral coefficient of thermal expansion (CTE) of the second die such that the CTEs of first die 32 and second die 34 match more closely than they would if the bottom side of hybrid assembly 30 was not mounted directly to a heat sink plate using indium bumps. For example, if first die 32 comprises GaSb or MCT and second die 34 comprises silicon, heat sink plate 40 constrains the lateral CTE of the silicon such that the CTEs of the first and second dies match more closely than they would if the dies were mounted to a silicon baseplate.

The present hybrid assembly mounting method enables all three epoxy joints required in the BCS structure described above to be eliminated. Indium has a much higher TC than epoxy (~82 Watts/(meter*Kelvin)). The indium layer will not be fully dense, but will have a much higher TC than does epoxy. Note that the indium on the heat sink plate does not have any electrical interconnection role. The material of the heat sink plate is preferably chosen so that it constrains the material of the second die to have a lateral CTE close to that of the material of the first die. For the examples described herein, this means choosing a heat sink plate material which constrains the silicon to have the same CTE as the MCT or GaSb.

The hybrid assembly mounting method described herein also provides good vertical thermal conductivity between the first and second dies and the heat sink plate, thereby enhancing the performance of hybrids that inherently generate heat, such as SLEDs, or that operate best at low temperatures, such as IR detectors.

The present method may be used with hybrid assemblies of any sort. It is particularly well-suited to applications in which good thermal performance is important or necessary to the proper operation of the device. One primary application is with a hybrid assembly in which second die 34 comprises a ROIC and first die 32 is a detector, such as a MCT detector, which comprises an array of pixels and is flip-chip mounted to the ROIC. Another primary application is with a hybrid assembly in which second die 34 comprises a RIIC and first die 32 comprises an array of LEDs such as a SLED array which is flip-chip mounted to the RIIC.

To further enhance thermal performance, a hybrid assembly may be mounted to a heat sink, the back side of which is in direct contact with a cryogenic coolant; this is illustrated in FIG. 3. Here, the back side of heat sink plate 40 is in direct contact with, for example, liquid nitrogen 44, with the entire assembly enclosed within an insulated enclosure 46 such as a dewar and under a vacuum 48. This technique is particularly well-suited to hybrid assemblies that include ICs for which cooling is essential, such as IR detectors or SLED arrays.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of improving the thermal performance of a hybrid assembly, comprising:
    forming a hybrid assembly, comprising:
        a first die having an associated coefficient of thermal expansion (CTE);
        a second die having an associated CTE; and
        indium bonds which bond and electrically interconnect a top of said first die to a top of said second die, where the first die is mounted on top of the second die, a side of said second die opposite said first die being a bottom side of said hybrid assembly;
    providing a heat sink plate on which said hybrid assembly is to be mounted;
    depositing a plurality of indium bumps on said heat sink plate where said hybrid assembly is to be mounted; and
    pressing the bottom side of said hybrid assembly onto the indium bumps so as to affix said hybrid assembly to said heat sink plate;
    said heat sink plate constraining the lateral CTE of said second die such that the CTE of said first die and the CTE of said second die match more closely than they would if the bottom side of said hybrid assembly was not affixed to said heat sink plate using indium bumps.

2. The method of claim 1, further comprising wicking epoxy into gaps between said the hybrid assembly and the heat sink plate.

3. The method of claim 1, wherein said heat sink comprises CuW.

4. The method of claim 1, wherein said heat sink comprises a diamond-metal composite.

5. The method of claim 1, wherein said first die comprises GaSb or mercury cadmium telluride and said second die comprises silicon, said heat sink constraining the CTE of said silicon such that the CTE of said first die and the CTE of said second die match more closely than they would if the bottom side of said hybrid assembly was mounted on a silicon heat sink.

6. The method of claim 5, wherein said second die comprises a readout IC (ROIC) and said first die comprises a detector comprising an array of pixels.

7. A method of improving the thermal performance of a hybrid assembly, comprising:
    forming a hybrid assembly, comprising:
        a first die;
        a second die; and
        indium bonds which bond and electrically interconnect a top of said first die to a top of said second die, where the first die is mounted on top of the second die, a side of said second die opposite said first die being a bottom side of said hybrid assembly;
    providing a heat sink plate on which said hybrid assembly is to be mounted;
    depositing a plurality of indium bumps on said heat sink plate where said hybrid assembly is to be mounted; and
    pressing the bottom side of said hybrid assembly onto the indium bumps so as to affix said hybrid assembly to said heat sink;
    wherein said first die comprises GaSb or mercury cadmium telluride and said second die comprises silicon, said heat sink constraining the lateral coefficient of thermal expansion (CTE) of said silicon such that the CTE of said first die and the CTE of said second die match more closely than they would if the bottom side of said hybrid assembly was mounted on a silicon heat sink plate; and
    wherein said second die comprises a read-in IC (RIIC) and said first die comprises an array of LEDs.

8. A method of improving the thermal performance of a hybrid assembly, comprising:
    forming a hybrid assembly, comprising:
        a first die;
        a second die; and
        indium bonds which bond and electrically interconnect a top of said first die to a top of said second die, where the first die is mounted on top of the second die, a side of said second die opposite said first die being a bottom side of said hybrid assembly;
    providing a heat sink plate on which said hybrid assembly is to be mounted;

depositing a plurality of indium bumps on said heat sink plate where said hybrid assembly is to be mounted; and pressing the bottom side of said hybrid assembly onto the indium bumps so as to affix said hybrid assembly to said heat sink plate;

wherein a back side of said heat sink plate is in direct contact with a cryogenic coolant and said hybrid assembly and coolant are within a dewar.

9. The method of claim 1, wherein said first die is flip-chip mounted on top of the second die.

* * * * *